US011357106B2

(12) United States Patent
Komaki

(10) Patent No.: US 11,357,106 B2
(45) Date of Patent: Jun. 7, 2022

(54) MEMORY SYSTEM

(71) Applicant: Kioxia Corporation, Tokyo (JP)

(72) Inventor: Hiroaki Komaki, Tachikawa (JP)

(73) Assignee: Kioxia Corporation, Tokyo (JP)

( * ) Notice: Subject to any disclaimer, the term of this patent is extended or adjusted under 35 U.S.C. 154(b) by 2 days.

(21) Appl. No.: 17/120,980

(22) Filed: Dec. 14, 2020

(65) Prior Publication Data

US 2022/0071008 A1 Mar. 3, 2022

(30) Foreign Application Priority Data

Aug. 31, 2020 (JP) .............................. JP2020-146386

(51) Int. Cl.
*H05K 1/11* (2006.01)
(52) U.S. Cl.
CPC ............. *H05K 1/115* (2013.01); *H05K 1/117* (2013.01); *H05K 2201/10159* (2013.01)
(58) Field of Classification Search
CPC .................. H05K 1/115; H05K 1/117; H05K 2201/10159
USPC ..................................................... 361/679.31
See application file for complete search history.

(56) References Cited

U.S. PATENT DOCUMENTS

| 8,379,426 | B2 | 2/2013 | Bang et al. |
| 10,198,333 | B2 | 2/2019 | Trobough et al. |
| 2006/0218445 | A1 | 9/2006 | Kudo |
| 2008/0151487 | A1* | 6/2008 | Ni ................... H01L 23/367 361/728 |
| 2010/0091539 | A1* | 4/2010 | Bang ................. G11C 29/1201 365/201 |
| 2011/0063790 | A1* | 3/2011 | Park ..................... H05K 1/0295 361/748 |
| 2013/0326539 | A1 | 12/2013 | Otani et al. |
| 2015/0373848 | A1* | 12/2015 | Seok ..................... H01C 13/02 361/767 |
| 2015/0380061 | A1 | 12/2015 | Matsumoto et al. |
| 2017/0083427 | A1 | 3/2017 | Xie et al. |

FOREIGN PATENT DOCUMENTS

| JP | 2006-268727 A | 10/2006 |
| JP | 2010-97686 A | 4/2010 |
| JP | 2012-79152 A | 4/2012 |

(Continued)

*Primary Examiner* — Sherman Ng
(74) *Attorney, Agent, or Firm* — Oblon, McClelland, Maier & Neustadt, L.L.P.

(57) ABSTRACT

According to one embodiment, in a memory system, a printed circuit board a first end portion and a second end portion. The second end portion is a portion arranged in an opposite side of the first end portion. Both of a semiconductor memory and a controller are disposed on the first surface. A edge connector is connectable to a host device and is disposed in the first end portion. Plural through-hole portions are disposed in the second end portion. Each of the plural through-hole portions penetrates from the first surface to the second surface. Each of the plural through-hole portions has an inner surface covered with an electrically-conductive film. Plural pad electrodes are disposed on the second surface in the second end portion. At least some of the plural through-hole portions are electrically connected to the controller. At least some of the plural pad electrodes are electrically connected to the controller.

20 Claims, 8 Drawing Sheets

(56) References Cited

FOREIGN PATENT DOCUMENTS

| JP | 2014-119779 A | 6/2014 |
|----|---------------|--------|
| JP | 5548966 B2 | 7/2014 |
| JP | 5628411 B2 | 11/2014 |
| JP | 2016-12693 A | 1/2016 |

* cited by examiner

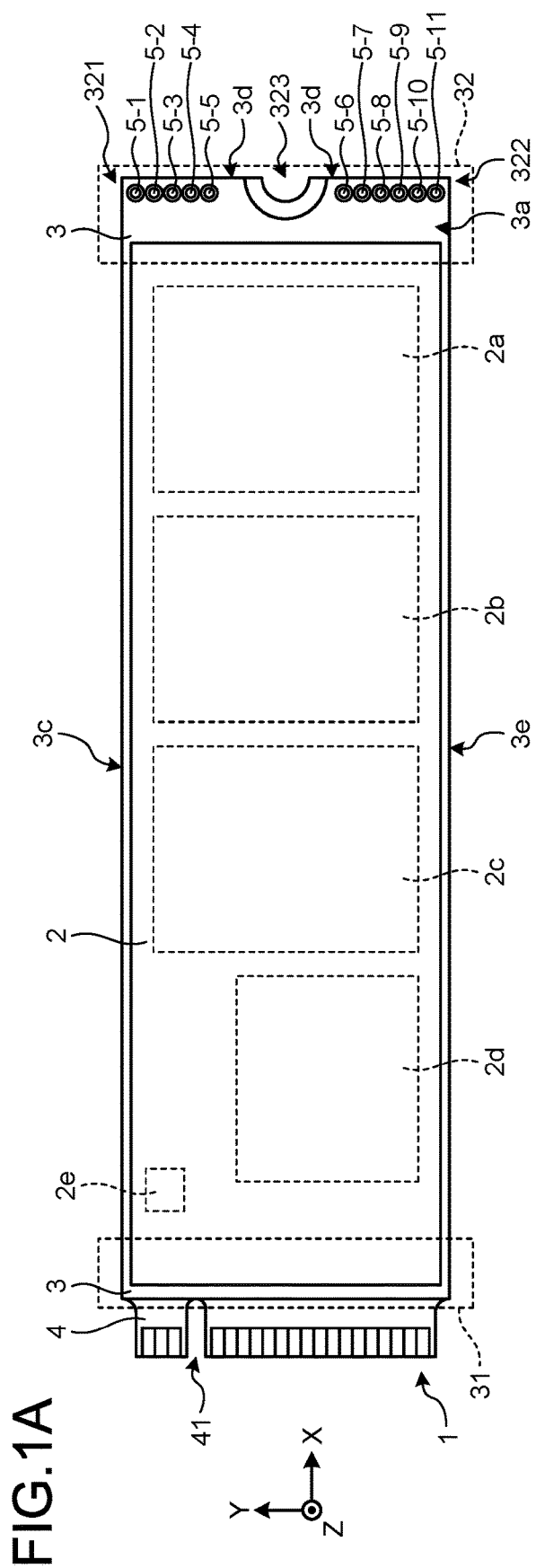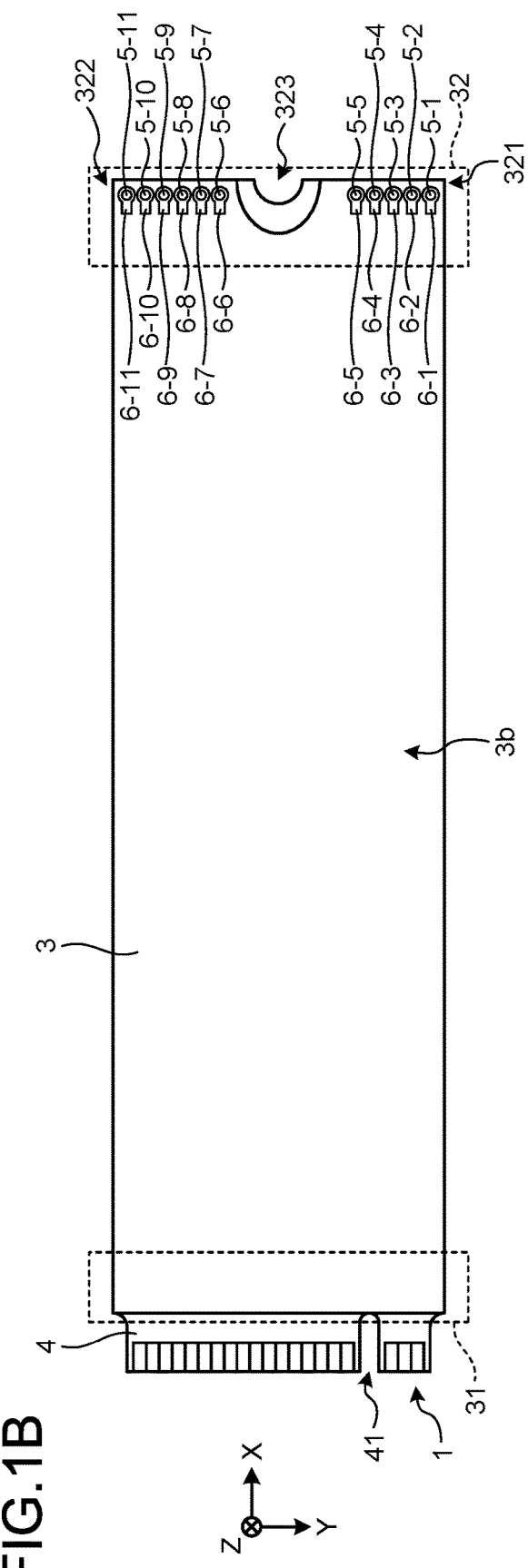

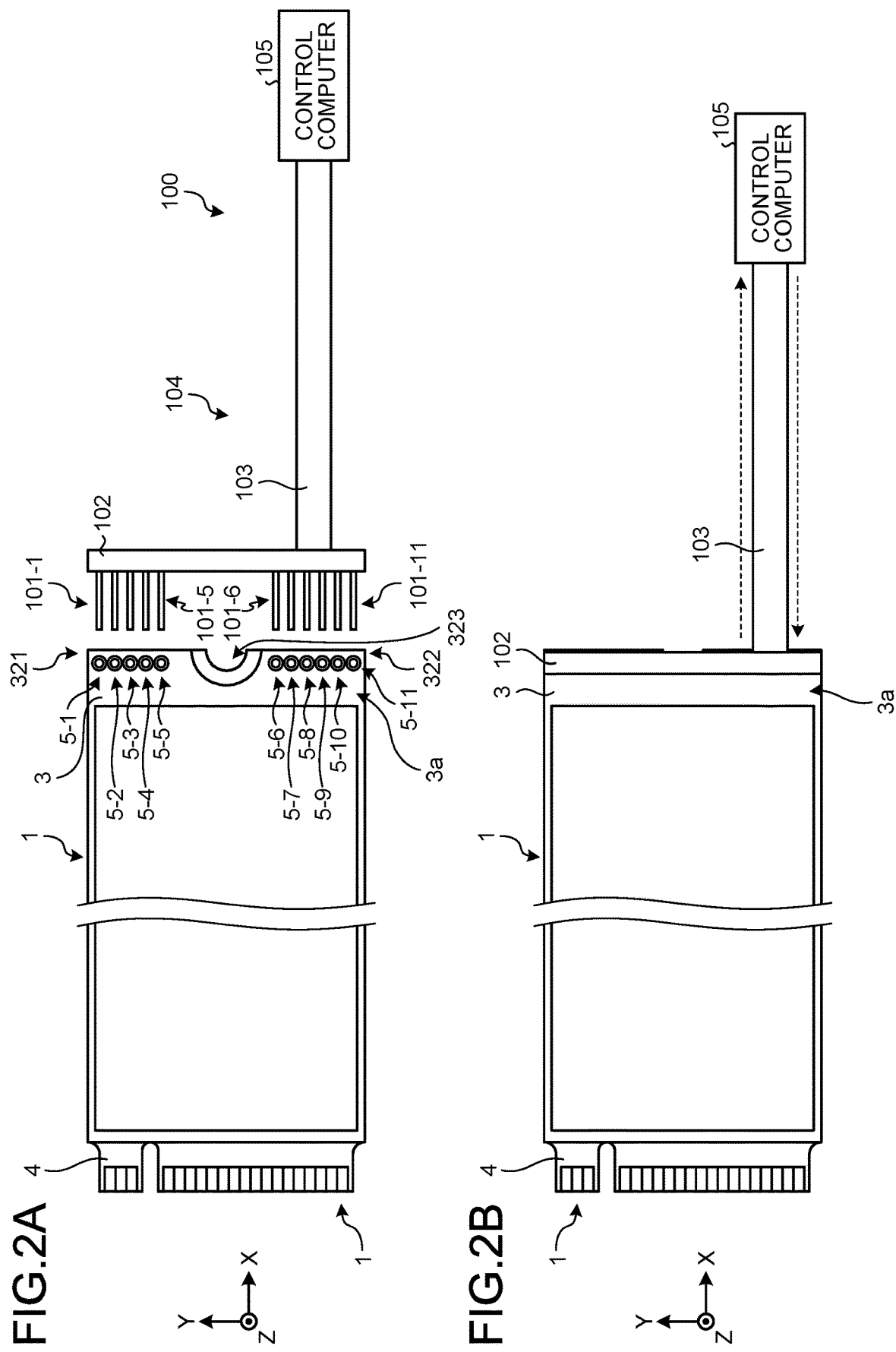

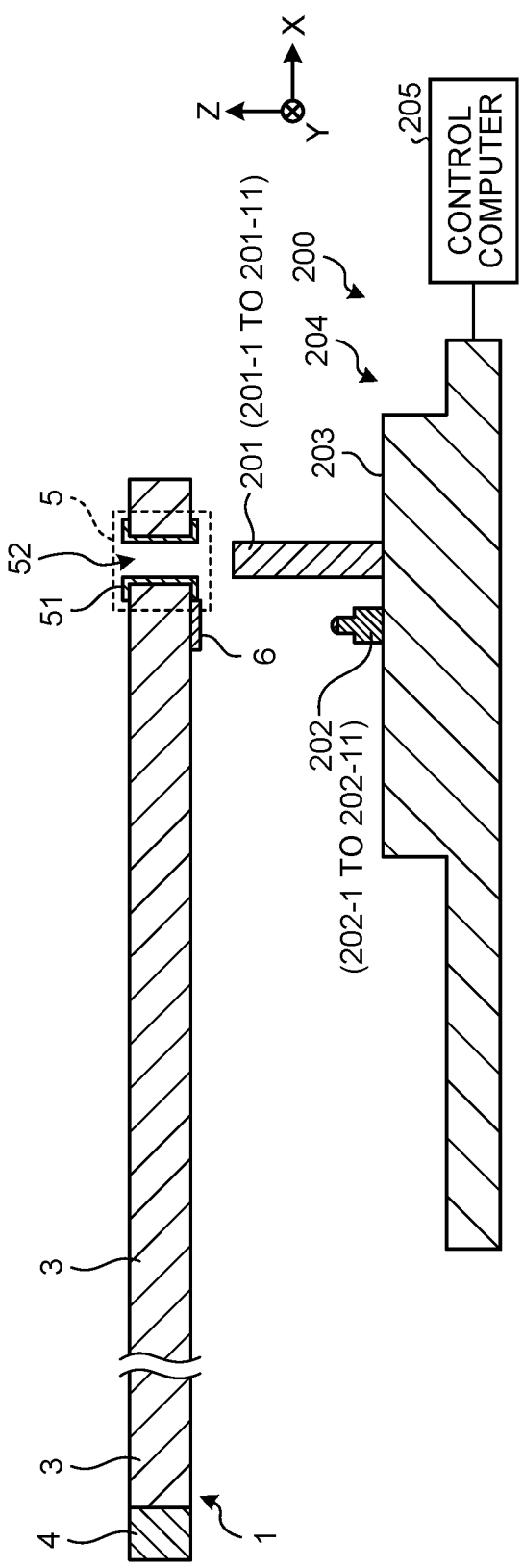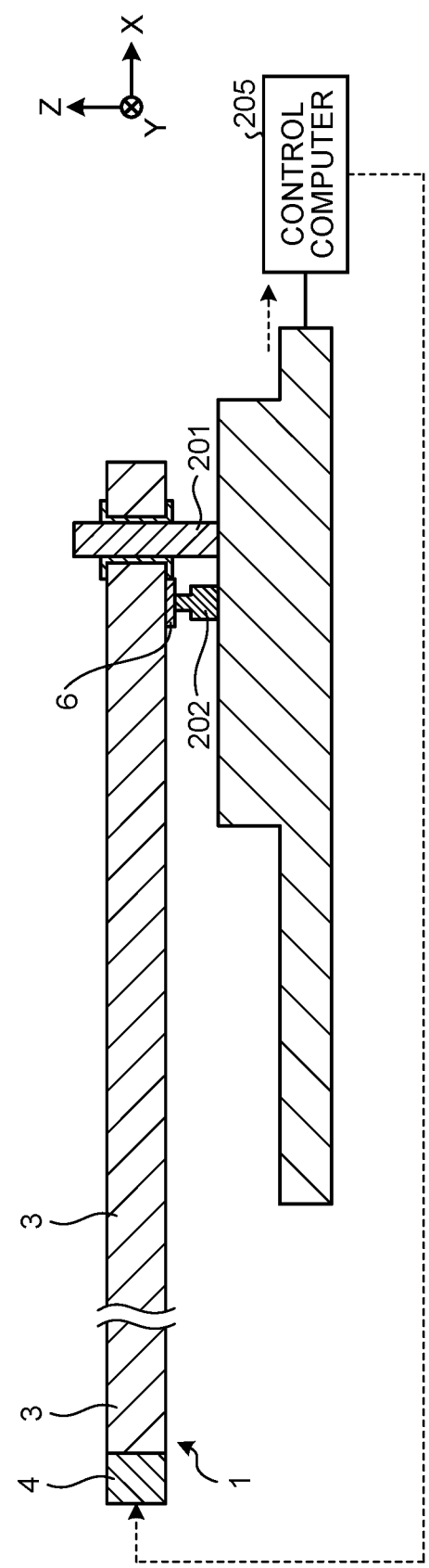

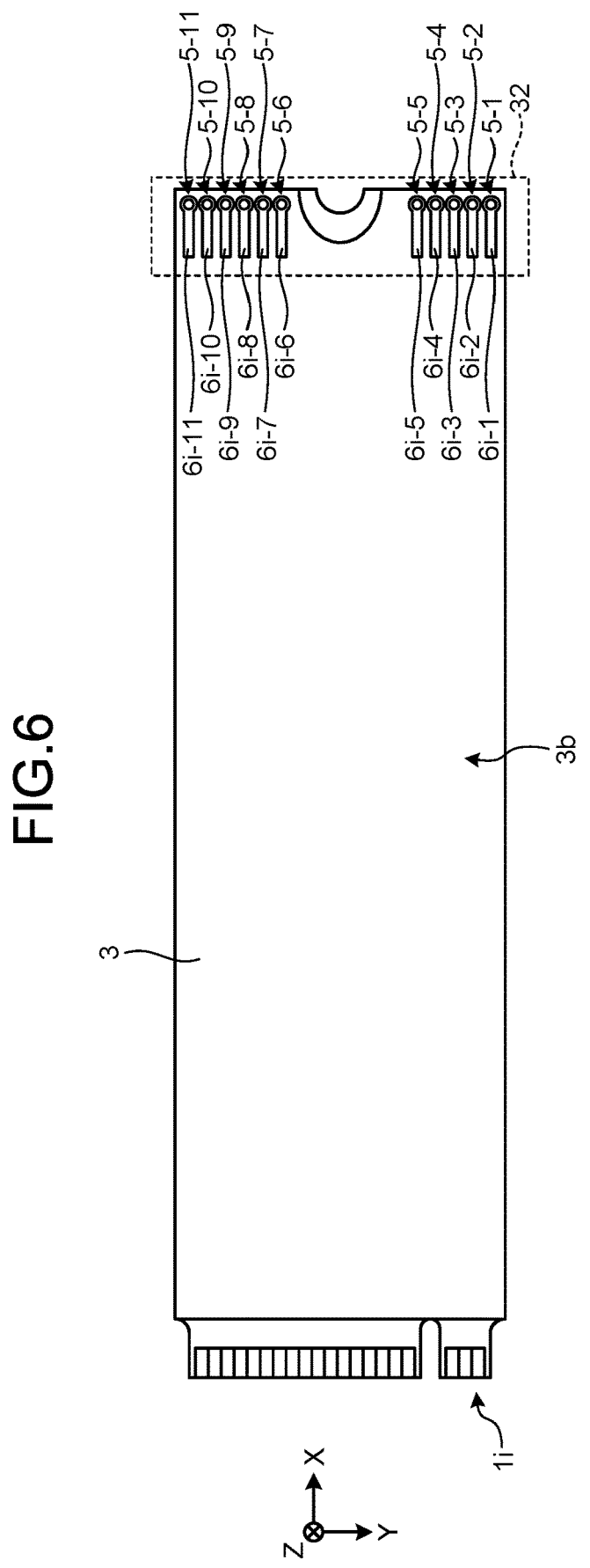

MEMORY SYSTEM

CROSS-REFERENCE TO RELATED APPLICATIONS

This application is based upon and claims the benefit of priority from Japanese Patent Application No. 2020-146386, filed on Aug. 31, 2020; the entire contents of which are incorporated herein by reference.

FIELD

Embodiments described herein relate generally to a memory system.

BACKGROUND

In a memory system provided with a semiconductor memory and a controller, a failure sometimes occurs during usage after shipment. The semiconductor memory and the controller are sealed in a single package or an individual package. The semiconductor memory and the controller sealed in such a package are mounted on a printed circuit board (PCB) of a memory system. Herein, it is desired to simplify failure analysis of the memory system in which the semiconductor memory and the controller are mounted on the PCB.

BRIEF DESCRIPTION OF THE DRAWINGS

FIG. 1A and FIG. 1B are plan views illustrating a configuration of a memory system according to an embodiment;

FIG. 2A and FIG. 2B are drawings illustrating an on-site test operation with respect to the memory system according to the embodiment;

FIG. 4A and FIG. 4B are drawings illustrating after-collection test operations with respect to the memory system according to the embodiment;

FIG. 6 is a plan view illustrating a configuration of a memory system according to a first modification example of the embodiment;

DETAILED DESCRIPTION

Figure 3A:
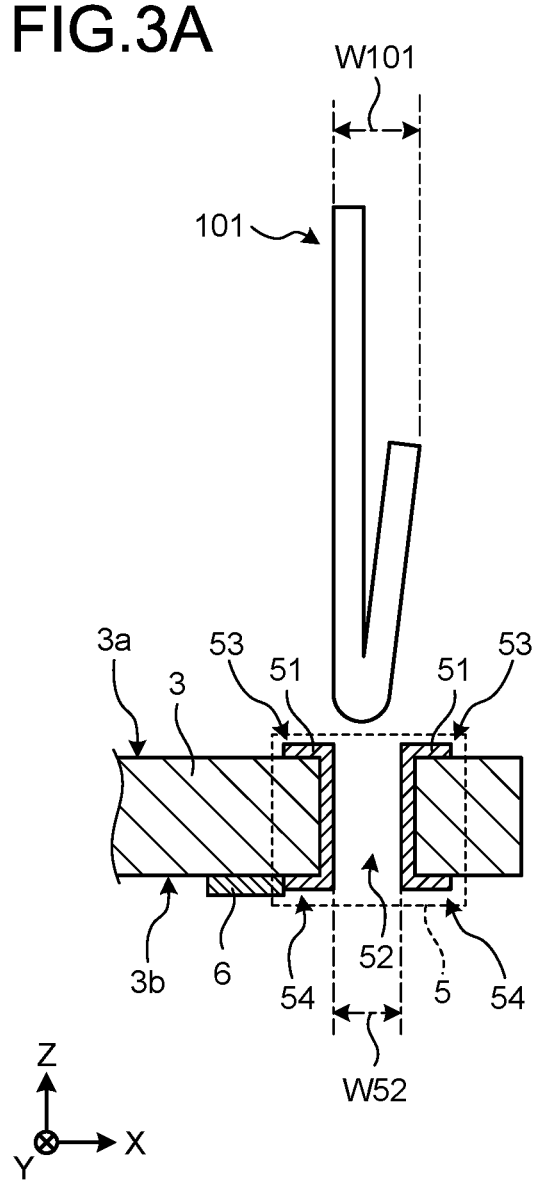
FIG. 3A and FIG. 3B are drawings illustrating insertion of a test pin into a through-hole structure according to the embodiment.

In general, according to one embodiment, there is provided a memory system including a printed circuit board, a semiconductor memory and a controller, an edge connector, plural through-hole portions, and plural pad electrodes. The printed circuit board has a first surface and a second surface. The second surface is an opposite surface of the first surface. The printed circuit board has a first end portion and a second end portion. The second end portion is a portion arranged in an opposite side of the first end portion. Both of the semiconductor memory and the controller are disposed on the first surface. The edge connector is connectable to a host device. The edge connector is disposed in the first end portion. The plural through-hole portions are disposed in the second end portion. Each of the plural through-hole portions penetrates from the first surface to the second surface. Each of the plural through-hole portions has an inner surface covered with an electrically-conductive film. The plural pad electrodes are disposed on the second surface in the second end portion. At least some of the plural through-hole portions are electrically connected to the controller. At least some of the plural pad electrodes are electrically connected to the controller.

Exemplary embodiments of a memory system will be explained below in detail with reference to the accompanying drawings. The present invention is not limited to the following embodiments.

Embodiment

A memory system according to an embodiment is configured to be provided with a printed circuit board (PCB) on which electronic components are mounted to have an edge connector for connection to a host device disposed at an end of the PCB.

In this memory system, a failure sometimes occurs during usage after shipment. An operator who has received a report of failure is dispatched to a usage location of a user to take a measure against the failure, and the operator sometimes subjects the memory system to failure analysis at the usage location of the user (on site). If the failure analysis cannot be carried out on site, the operator sometimes brings back the memory system, in which the failure has occurred, to carry out failure analysis. In this case, it is difficult to quickly specify a location of the failure.

For example, in order to enable on-site failure analysis, it is conceivable to employ a first configuration in which gold fingers, which can be said to be a test-dedicated edge connector, are provided in an end portion in the opposite side of an edge connector of the PCB of the memory system. In the first configuration, a test-dedicated socket supporting the gold fingers has to be connected. However, since the edge connector is in a state of being attached to the host device, it is difficult to connect the socket to the gold fingers that are pads for testing. Depending on a connection form of the host device of the user, the socket cannot be connected to the pads on-site.

Also, in the first configuration, contact points are easily deteriorated due to frictions caused by contact between the gold fingers and the socket, and the durable number of times is low. Therefore, if the memory system in which the failure has occurred is collected and applied to a high-performance expensive test jig capable of carrying out advanced failure analysis, the usable number of times is low.

Also, it is conceivable to employ a second configuration in which through-hole structures penetrating through a PCB from a certain surface thereof to the opposite surface and having an inner surface covered with an electrically-conductive film so that general-purpose test pins can be inserted therein are provided in an end portion in the opposite side of an edge connector of the PCB of a memory system. In the second configuration, since a test jig can be connected by the general-purpose test pins, on-site simple failure analysis can be carried out.

However, in the second configuration, contact points are easily deteriorated due to frictions caused by the contact between the electrically-conductive film and the test pins, and the durable number of times of the through-hole structures is low. Therefore, if the memory system in which the failure has occurred is collected and applied to a high-performance expensive test jig capable of carrying out advanced failure analysis, the usable number of times is low.

On the other hand, in order to enable detailed failure analysis after collection, it is conceivable to employ a third configuration in which pad electrodes for testing are provided on a certain surface of the PCB of the memory system. In the third configuration, positioning for bringing test pins into contact with the pad electrodes is required, and a large-scale device is required as a test jig, for example, the location of the memory system is perceived by a camera (image sensor or the like) to carry out aligning by servo control.

Therefore, in the present embodiment, in a memory system, through-hole structures penetrating a PCB from a first surface to a second surface and having an inner surface covered with an electrically-conductive film are provided in an end portion in the opposite side of an end portion in which an edge connector is provided of the PCB, and pad electrodes are provided in vicinities of the through-hole structures on the second surface in order to facilitate both of on-site and after-collection failure analysis and simplify a jig/device therefor.

Specifically, if a failure occurs during usage after the memory system is shipped out, on-site failure analysis is carried out by using the through-hole structures. When the test pins are inserted to the through-hole structures in a state in which the memory system is attached to the device of the user by the edge connector, the test pins can be reliably brought into contact with the through-hole structures. When data necessary for operation analysis of the memory system is acquired in this state via the through-hole structures and the test pins, failure analysis can be carried out even on site. Since contents of the occurred failure is analyzed to take a measure based on the data acquired on the device of the user, the period from occurrence of the failure until the measure is taken can be shortened, and reproduction of the failure after collection is enabled.

Also, after-collection failure analysis is carried out by using the pad electrodes and the through-hole structures. In this failure analysis, a test jig in which positioning pins are disposed near pogo pins is used. The positioning pins of this test jig are inserted to the through-hole structures, and the memory system is pressed against the jig. As a result, distal ends of the pogo pins can be reliably brought into contact with the pad electrodes. The data necessary for operation analysis of the memory system is acquired via the pad electrodes and the pogo pins in this state. As a result, failure analysis equivalent to on-site failure analysis can be carried out or more complex failure analysis can be carried out with more time than that of on-site failure analysis. Furthermore, since a durable number of times of the pogo pins and the pad electrodes is larger than a durable number of times of the test pins and the through-hole structures, the highly-functional expensive test jig used after collection can be used by a larger number of times.

More specifically, a memory system 1 is configured in a manner illustrated in FIG. 1A and FIG. 1B. FIG. 1A and FIG. 1B are plan views illustrating a configuration of the memory system 1. FIG. 1A is a plan view illustrating the memory system 1 from a first surface 3a side of a PCB 3, and FIG. 1B is a plan view illustrating the memory system 1 from a second surface 3b side of the PCB 3. Hereinafter, a surface on which a cover 2 is disposed, of the PCB 3 provided in the memory system 1 is assumed to be a first surface 3a, and a surface in an opposite side of the first surface 3a, of the PCB 3 is assumed to be a second surface 3b. A direction perpendicular to the first surface 3a or the second surface 3b of the PCB 3 is assumed to be a Z direction, a longitudinal direction of the PCB 3 is assumed to be an X direction, and a direction perpendicular to the Z direction and the X direction is assumed to be a Y direction. The Y direction is a short-side direction of the PCB 3.

The memory system 1 is, for example, a solid state drive (SSD). The memory system 1 is connected so as to be able to communicate with a host device (not illustrated) and can function as an external storage device for the host device. The host device may be, for example, an information processing device such as a personal computer, a mobile phone, or an imaging device. Further, the host device may be a mobile terminal such as a tablet computer or a smartphone, may be game equipment, may be an in-vehicle terminal such as a car navigation system, may be a communications infrastructure device such as a base station of a mobile communication system, or may be a data server which forms a storage of cloud computing. Power is supplied from the host device, and a general-purpose high-speed serial bus of SATA or PCIe for communication of control signals including reset and data, is connected between the host device and the memory system 1.

The memory system 1 has the cover 2, the PCB 3, an edge connector 4, plural through-hole structures 5 (5-1 to 5-11), and plural pad electrodes 6 (6-1 to 6-11).

The cover 2 is disposed so as to cover a component such as a package of a semiconductor chip in which a semiconductor integrated circuit is provided. For example, the cover 2 illustrated by a solid line in FIG. 1A is disposed so as to cover, for example, packages 2a to 2c of semiconductor memories, a package 2d of a system on chip (SoC) including a controller, and another electronic component 2e, each illustrated by dotted lines in FIG. 1A. Information such as manufacturing/sales manufacturer names, a product name, and a memory capacity of the memory system 1 is printed on the cover 2. The semiconductor memories may be non-volatile memories such as NAND-type flash memories.

In an XY planar view, the PCB 3 has a shape along an approximate rectangle having the X direction as a longitudinal direction and extending in the XY directions. The PCB 3 has an end portion 31 and an end portion 32. The end portion 31 and the end portion 32 are end portions in mutually opposite sides of the PCB 3 and are disposed in the mutually opposite sides with the cover 2 interposed therebetween. The end portion 31 is an end portion in a −X side of the PCB 3, and the end portion 32 is an end portion in a +X side of the PCB 3. The end portion 32 has corner portions 321 and 322 at both ends in the Y direction and has a cutout portion 323 in a vicinity of a center in the Y direction. The corner portion 321 is disposed in a region of a +Y side in the end portion 32. The corner portion 322 is disposed in a region of a −Y side in the end portion 32. The cutout portion 323 has an approximately semicircular shape in the XY planar view. The cutout portion 323 is a part which serves as a guide of a screw when the PCB 3 of the memory system 1 is fixed to a body (not illustrated) of the host device by screwing. The cutout portion 323 enables not only fixation of the PCB 3, but also enables alignment to a reference potential (ground level) of an electric circuit and dissipation of generated heat of the memory system 1 to the host device.

The edge connector 4 is disposed in the end portion 31 of the PCB 3. The edge connector 4 can be electrically connected to components on the PCB 3 via wirings on the PCB 3 (for example, on the first surface 3a). The edge connector 4 has a shape supporting specifications of form factor standards (for example, M.2-2280 standards). A notch-like cutout 41 is provided in the edge connector 4 at a position of "M key" of the form factor standards. The memory system 1 can be attached to a socket (not illustrated) mounted on the host device via the edge connector 4. The edge connector 4 is configured so that a projection provided on the socket fits the cutout 41 when the edge connector 4 is attached to the socket. The cutout 41 is at a position shifted from a short-side direction (Y-direction) center. By virtue of this, the memory system 1 can be prevented from being oppositely attached to the host device between the first surface and the second surface. The controller carries out communication compliant with serial communication standards (for example, PCIe standards or SATA standards) with the host via the edge connector 4. The memory system 1 is connected to the socket of the host device via the edge connector 4 and is fixed to the host device by screwing by using the cutout portion 323 as a guide.

As illustrated in FIG. 1A and FIG. 1B, the plural through-hole structures 5-1 to 5-11 are disposed in the end portion 32 of the PCB 3. The plural through-hole structures 5-1 to 5-11 include the through-hole structures 5-1 to 5-5, which are disposed between the cutout portion 323 and the corner portion 321, and the through-hole structures 5-6 to 5-11, which are disposed between the cutout portion 323 and the corner portion 322. By virtue of this, many through-hole structures can be efficiently disposed in the end portion 32 of the PCB 3.

Among the plural through-hole structures 5-1 to 5-11, the through-hole structure 5-1 is disposed in a vicinity of the corner portion 321 of the PCB 3, and the through-hole structure 5-11 is disposed in a vicinity of the corner portion 322 of the PCB 3. By virtue of this, when positioning pins 201 (see FIG. 4B) are inserted in respective through-hole structures 5 in a test after collection, the PCB 3 can be prevented from being rotated about the Z axis, and the PCB 3 can be easily positioned.

Among the plural through-hole structures 5-1 to 5-11, the number of the through-hole structures 5-1 to 5-5 disposed between the cutout portion 323 and the corner portion 321 and the number of the through-hole structures 5-6 to 5-11 disposed between the cutout portion 323 and the corner portion 322 are different from each other. By virtue of this, when test pins 101 (see FIG. 2A) are inserted to respective through-hole structures 5 in an on-site test, a test jig 104 (see FIG. 2A) can be prevented from being attached in a direction opposite to an appropriate direction.

Each through-hole structure 5 has an approximately cylindrical shape penetrating through the PCB 3 from the first surface 3a to the second surface 3b. A through hole 52 is provided in each of the through-hole structures 5. An opening diameter W52 of each of the through-hole structures 5 corresponds to a maximum planar width W101 (see FIG. 3A) of the test pin 101 of a spring type used in the on-site test, and also corresponds to a diameter D201 (see FIG. 5A) of the positioning pin 201, which is used in the test after collection. The opening diameter W52 of each of the through-hole structures 5 may satisfy Mathematical Expression 1 between the maximum planar width W101 of the test pin 101 and the diameter D201 of the positioning pin 201.

$$D201 < W52 < W101 \quad \text{Mathematical Expression 1}$$

In the embodiment, as an example, following values, which are general numerical values, are employed.

D201=0.65 mm
W52=0.85 mm
W101=0.95 mm when released, minimum value: 0.60 mm

An inner surface of each of the through-hole structures 5 is covered with an electrically-conductive film 51 (see FIG. 3A). The electrically-conductive film 51 may further cover a +Z-side edge portion 53 and a −Z-side edge portion 54 of the through hole 52. A part of the electrically-conductive film 51 covering the edge portion 53 extends like a hollowed disk in the XY planar view and is electrically connected to a +Z-side end portion of a part of the electrically-conductive film 51 covering the inner surface. A part of the electrically-conductive film 51 covering the edge portion 54 extends like a hollowed disk in the XY planar view and is electrically connected to a −Z-side end portion of the part of the electrically-conductive film 51 covering the inner surface. In an XZ cross-sectional view, the electrically-conductive film 51 has two approximately transverse U shapes, which are separated from each other in the X direction and are open in opposite sides.

The electrically-conductive film 51 can be formed of an electrically-conductive substance such as copper or solder. Each of the through-hole structures 5 is electrically connected to a terminal of the controller covered with the cover 2. The terminal of the controller to which the through-hole structure 5 is connected is a terminal used in a test. This terminal is, for example, a terminal of serial I/F-A and serial I/F-B for setting an operation mode of the memory system 1 and reading an internal state of the controller and data stored in the semiconductor memory.

An outer edge of the PCB 3 includes plural sides 3c, 3d, and 3e along the approximate rectangle. The side 3c is disposed in a +Y side compared with the other sides 3d and 3e and extends along the X direction. The side 3d is disposed at a position between the other sides 3c and 3e in the Y direction and extends along the Y direction. The side 3e is disposed in a −Y side compared with the other sides 3c and 3d and extends along the X direction. The plural through-hole structures 5-1 to 5-11 are disposed in a vicinity of the side 3d in the end portion 31 and is arranged along the side 3d.

As illustrated in FIG. 1B, the plural pad electrodes 6-1 to 6-11 are disposed on the second surface 3b of the PCB 3. On the second surface 3b of the PCB 3, the plural pad electrodes 6-1 to 6-11 are disposed so as to be close to the plural through-hole structures 5-1 to 5-11, respectively. In a vicinity of the side 3d in the end portion 32 of the PCB 3, the plural pad electrodes 6-1 to 6-11 are arranged in the Y direction along the side 3d. The plural pad electrodes 6-1 to 6-11 are separated from each other in the Y direction and are electrically insulated from each other. The plural pad electrodes 6-1 to 6-11 correspond to the plural through-hole structures 5-1 to 5-11, respectively. Between each of the pad electrodes 6 and the side 3d, the corresponding through-hole structure 5 is disposed.

A planar dimension W6 (see FIG. 5B) of each of the pad electrodes 6 corresponds to a planar dimension W202 of a distal end portion 202a of a pogo pin 202, which is used in the test after collection. The planar dimension W6 of each of the pad electrodes 6 may satisfy the following Mathematical Expression 2 in relation to the planar dimension W202 of the distal end portion 202a of the pogo pin 202.

$$W202 \leq W6 \quad \text{Mathematical Expression 2}$$

Note that a Y-direction planar dimension and an X-direction planar dimension of each of the pad electrodes 6 may be equivalent to the opening diameter of the through-hole structure 5 or may have a value which is smaller than the opening diameter of the through-hole structure 5 while Mathematical Expression 2 is satisfied.

Each of the pad electrodes 6 can be formed of an electrically-conductive substance such as copper or solder. Each of the pad electrodes 6 is electrically connected to the electrically-conductive film 51 of the corresponding through-hole structure 5. Each of the pad electrodes 6 is electrically connected to the terminal of the controller, which is covered with the cover 2, via the electrically-conductive film 51 of the through-hole structure 5. The terminal of the controller to which the pad electrode 6 is connected is a terminal useful in the test. This terminal is, for example, a terminal of serial I/F-A and serial I/F-B for setting an operation mode of the memory system 1 and reading an internal state of the controller and data stored in the semiconductor memory.

On-site failure analysis with respect to the memory system 1 is carried out, for example, by test operations as illustrated in FIG. 2A and FIG. 2B. FIG. 2A and FIG. 2B are drawings illustrating the on-site test operation with respect to the memory system 1. The on-site failure analysis is carried out in a state in which the memory system 1 is connected to the host device via the edge connector 4.

In the on-site test operation illustrated in FIG. 2A, a test device 100 including the test jig 104 is prepared. The test jig 104 is connected to the plural through-hole structures 5-1 to 5-11 of the memory system 1. The test device 100 has the test jig 104 and a control computer 105. The test jig 104 has plural test pins 101 (101-1 to 101-11), a flexible conversion jig 102, and a flexible cable 103. The flexible cable 103 includes plural wirings corresponding to the test pins 101-1 to 101-11. The flexible conversion jig 102 electrically connects the test pins 101-1 to 101-11 while the memory system 1 is attached to the corresponding wirings. The plural wirings of the flexible cable 103 are electrically connected to the control computer 105.

The plural test pins 101-1 to 101-11 correspond to the plural through-hole structures 5-1 to 5-11 of the memory system 1, respectively. The test pins 101-1 to 101-5 are inserted in the through-hole structures 5-1 to 5-5, respectively, and the test pins 101-6 to 101-11 are inserted in the through-hole structures 5-6 to 5-11, respectively. Herein, in the memory system 1, the number of the through-hole structures 5-1 to 5-5 disposed between the cutout portion 323 and the corner portion 321 and the number of the through-hole structures 5-6 to 5-11 disposed between the cutout portion 323 and the corner portion 322 are different from each other. By virtue of this, when test pins 101 are inserted to the respective through-hole structures 5, the test jig 104 can be prevented from being attached in the direction opposite to the appropriate direction.

As illustrated in FIG. 3A, each of the test pins 101 has a shape in which a distal end side is bent in an approximately V shape in an XZ lateral view and is configured as a spring-type test pin. FIG. 3A is a drawing illustrating a state before the test pin 101 is inserted to the through-hole structure 5. FIG. 3A is an X-direction cross-sectional view of an approximately central portion of the through-hole structure 5 in the XY planar view. In the X direction, the maximum planar width W101 of each of the test pins 101 is slightly larger than the opening diameter W52 of the through-hole structure 5. Although it is not illustrated, in the Y direction, the planar width of each of the test pins 101 is smaller than the opening diameter of the through-hole structure 5. In the embodiment, the diameter of each of the test pins 101 is φ=0.3 mm, which is a general numerical value.

Corresponding to the fact that the distal end side of each of the test pins 101 has a shape bent in an approximately V shape in the XZ plane, the opening shape of the through-hole structure 5 may be a shape along an approximate ellipse having a major axis in the X direction in the XY planar view. Since the test device 100 can use general-purpose test pins as the test pins 101, test cost can be easily reduced.

Figure 3B:
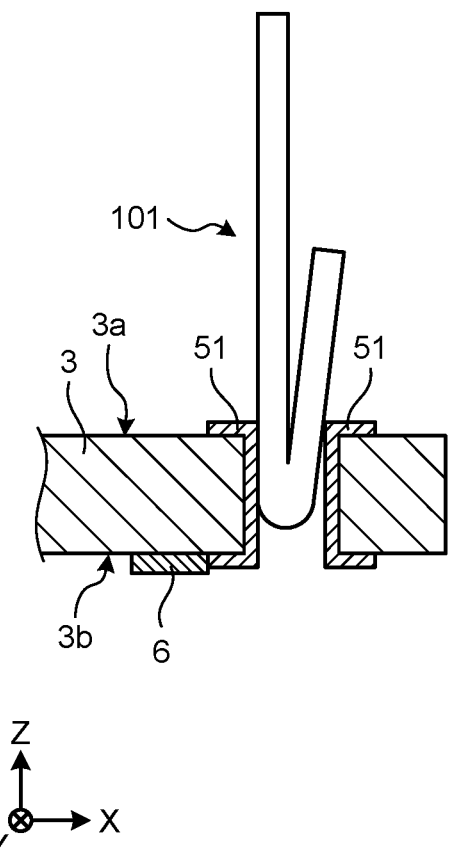

In the on-site test operation illustrated in FIG. 2B, a +X-side surface of the flexible conversion jig 102 illustrated in FIG. 2A is in a position facing the +Z side in FIG. 2B. At this point, each of the test pins 101 is in a state in which the distal end thereof is positioned in the −Z side with respect to the flexible conversion jig 102. Then, each of the test pins 101 is inserted in the through hole 52 of the through-hole structure 5 as illustrated in FIG. 3A, and the test pin 101 is brought into contact with the electrically-conductive film 51, which is the inner surface of the through-hole structure 5, as illustrated in FIG. 3B. At this point, since the distal end side of the test pin 101 is a spring having the approximately V shape, the distal end of the test pin 101 is pressed against the electrically-conductive film 51 of the through-hole structure 5. By virtue of this, the distal end of the test pin 101 can be reliably brought into contact with the electrically-conductive film 51 of the through-hole structure 5. FIG. 3B is a drawing illustrating a state in which the test pin 101 is inserted in the through-hole structure 5. FIG. 3B is an X-direction cross-sectional view of the approximately central portion of the through-hole structure 5 in the XY planar view. FIG. 2B illustrates a state in which the flexible conversion jig 102 and the plural test pins 101-1 to 101-11 are attached to the PCB 3. In this state, the control computer 105 illustrated in FIG. 2B supplies test signals to the memory system 1 via the flexible cable 103, the flexible conversion jig 102, the test pins 101, and the electrically-conductive films 51 of the through-hole structures 5. The control computer 105 acquires test results from the memory system 1 via the electrically-conductive films 51 of the through-hole structure 5, the test pins 101, the flexible conversion jig 102, and the flexible cable 103.

If a failure occurs during usage, for example, the control computer 105 switches the operation mode of the memory system 1 to "operation mode setting-A" via the signals of the through-hole structures 5-1 to 5-5 and the test pins 101-1 to 101-5 and acquires the internal state of the controller from the "serial I/F-A" of the controller.

In addition to that, the control computer 105 switches the operation mode of the memory system 1 to "operation mode setting-B" via the signals of the through-hole structures 5-6 to 5-8 and the test pins 101-6 to 101-8 and acquires the internal state of the semiconductor memory from the "serial I/F-B" of the controller.

Furthermore, the control computer 105 switches the operation mode of the memory system 1 to "operation mode setting-C" via the signals of the through-hole structures 5-9 to 5-11 and the test pins 101-9 to 101-11 and carries out other confirmations of setting of test conditions, state, etc. by communicating with electronic components in the memory system 1.

Herein, general-purpose test pins can be used as the test pins 101. The test jig 104 including the plural general-purpose test pins as the plural test pins 101-1 to 101-11 can be said to be an inexpensive test jig.

The control computer 105 can easily carry out on-site failure analysis by carrying out, for example, debugging depending on the test results.

Note that FIG. 2B illustrates, as an example, the case in which the test pins 101 are inserted from the first-surface-3a side of the PCB 3. However, for example, if a mounting method of the memory system 1 used by a user is opposite between the first surface and the second surface, the test may be carried out by inserting the test pins 101 from the second-surface-3b side of the PCB 3.

Also, failure analysis after collection with respect to the memory system 1 is carried out, for example, by a test operation as illustrated in FIG. 4A and FIG. 4B. FIG. 4A and FIG. 4B are drawings illustrating after-collection test operations with respect to the memory system 1. FIG. 4A and FIG. 4B are cross-sectional views of a case in which the approximately central portion of the through-hole structure 5 is sectioned in the X direction in the XY planar view.

In the after-collection test operation illustrated in FIG. 4A, a test device 200 including a test jig 204 is prepared. The test jig 204 is connected to the plural through-hole structures 5-1 to 5-11 and the plural pad electrodes 6-1 to 6-11 of the memory system 1. The test device 200 has the test jig 204 and a control computer 205. The test jig 204 has plural positioning pins 201 (201-1 to 201-11), plural pogo pins 202 (202-1 to 202-11), and a jig main body 203. The jig main body 203 includes plural wirings corresponding to the plural pogo pins 202-1 to 202-11. The plural wirings of the jig main body 203 are electrically connected to the control computer 205. In the jig main body 203, the plural pogo pins 202-1 to 202-11 are disposed to be close to the plural positioning pins 201-1 to 201-11. Each of the pogo pins 202 is formed of an electrically-conductive matter such as copper. Each of the positioning pins 201 can be formed of an arbitrary material such as an electrically-conductive matter or an insulative matter. The positioning pins 201 are in a mutually electrically independent state (in other words, mutually electrically insulated state).

The plural positioning pins 201-1 to 201-11 correspond to the plural through-hole structures 5-1 to 5-11, respectively. The plural pogo pins 202-1 to 202-11 correspond to the plural pad electrodes 6-1 to 6-11, respectively. The positioning pins 201-1 to 201-11 are inserted to the through-hole structures 5-1 to 5-11, respectively. At that point, in the memory system 1, the plural pad electrodes 6-1 to 6-11 are disposed to be close to the plural through-hole structures 5-1 to 5-11, respectively. By virtue of this, when each of the positioning pins 201 is inserted to each of the through-hole structures 5, the pogo pin 202 can be easily aligned with the position of the pad electrode 6.

Figure 5A:
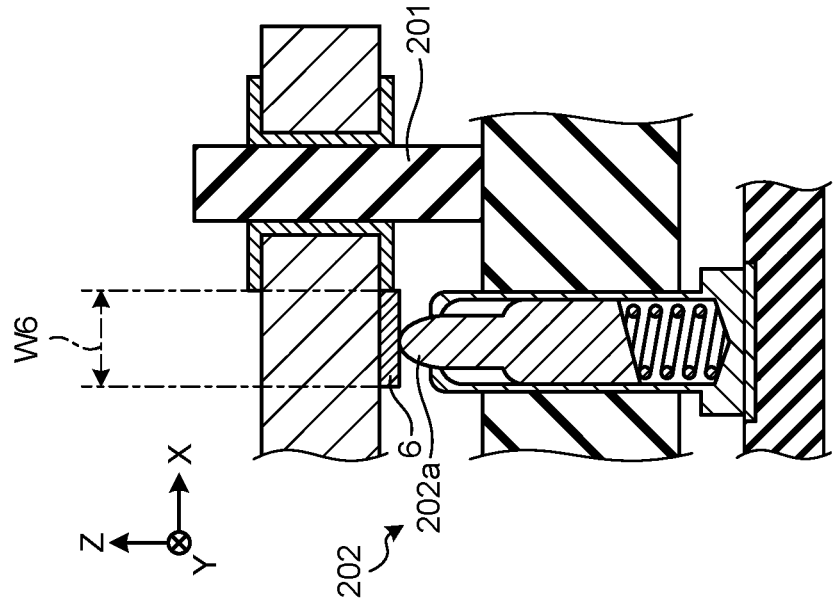
FIG. 5A and FIG. 5B are drawings illustrating contact of a pogo pin with a pad electrode according to the embodiment.

As illustrated in FIG. 5A, each of the pogo pins 202 has a distal end portion 202a and a base portion 202b. As illustrated in FIG. 5A, the distal end portion 202a has an approximately reverse U shape in the XZ cross-sectional view. The distal end portion 202a and the base portion 202b are connected to each other and integrally formed. The distal end portion 202a bulges out from a +Z-side opening of a cylinder 204, and the base portion 202b connected to the distal end portion 202a is housed in the cylinder 204. The base portion 202b is biased toward the +Z side by a spring 203 in the cylinder 204. FIG. 5A is a drawing illustrating a state before the pogo pin 202 is brought into contact with the pad electrode 6. FIG. 5A is an X-direction cross-sectional view of an approximately central portion of the pogo pin 202 in the XY planar view.

Figure 5B:
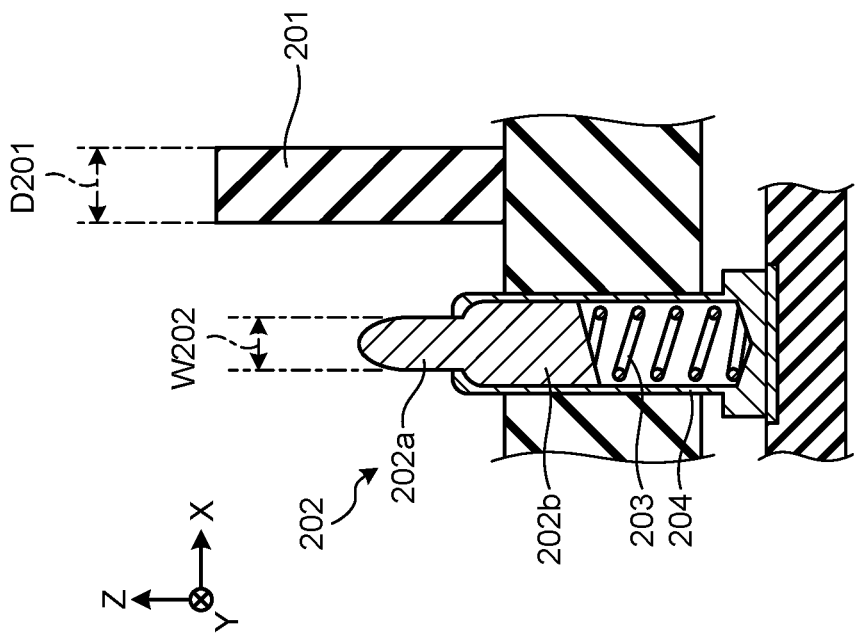

In the after-collection test operation illustrated in FIG. 4B, each of the positioning pins 201 is inserted in the through hole 52 of each of the through-hole structures 5. In this state, as illustrated in FIG. 5B, each of the pogo pins 202 is positioned at the position of each of the pad electrodes 6, and the distal end portion 202a of each of the pogo pins 202 is brought into contact with each of the pad electrodes 6. At this point, since the distal end portion 202a and the base portion 202b are pushed down, the distal end portion 202a and the base portion 202b are pushed back upward by the spring 203. Therefore, the distal end portion 202a can firmly pressurize the pad electrode 6, and the pogo pin 202 can be reliably brought into contact with the pad electrode 6. FIG. 5B is a drawing illustrating a state in which the pogo pin 202 contacts the pad electrode 6. FIG. 5B is an X-direction cross-sectional view of an approximately central portion of the pogo pin 202 in the XY planar view. Herein, the planar dimension W6 of the pad electrode 6 is only required to be larger than the planar dimension W202 of the distal end portion 202a of the pogo pin 202. The planar dimension W6 of the pad electrode 6 may be a dimension which is equivalent to the opening diameter W52 of the through-hole structure 5.

In this state, the control computer 205 illustrated in FIG. 4B causes the memory system 1 to simulate the host device of the user on site and reproduce a failure via the edge connector 4.

The control computer 205 acquires the setting of the operation mode and the internal state from the memory system 1 via the pad electrodes 6, the pogo pins 202, and the wires in the jig main body 203.

Since the control computer 205 illustrated in FIG. 4B is a test jig used in failure analysis after collection different from the host device of the user on site, the control computer 205 can include the host device connected to the memory system 1 in order to efficiently reproduce failure.

For example, an extracted operation of the host device caused by a failure which has occurred on site can be used as a test pattern from the control computer 205 with respect to the edge connector 4 to operate the memory system 1.

When the failure is reproduced in the memory system 1, for example, the control computer 205 switches the operation mode of the memory system 1 to the "operation mode setting-A" via the signals of the pad electrodes 6-1 to 6-5 and the pogo pins 202-1 to 202-5 and acquires the internal state of the controller from "serial I/F-A" of the controller.

In addition to that, the control computer 205 switches the operation mode of the memory system 1 to "operation mode setting-B" via the signals of the pad electrodes 6-6 to 6-8 and the pogo pins 202-6 to 202-8 and acquires the internal state of the semiconductor memory from the "serial I/F-B" of the controller.

Furthermore, the control computer 205 switches the operation mode of the memory system 1 to "operation mode setting-C" via the signals of the pad electrodes 6-9 to 6-11 and the pogo pins 202-9 to 202-11 and carries out other confirmations of setting of test conditions, etc. by communicating with ICs in the memory system 1.

Herein, the durable number of times of the pogo pins 202 and the pad electrodes 6 is larger than the durable number of times of the test pins 101 and the through-hole structures 5. For example, while the durable number of times of the test pins 101 and the through-hole structures 5 is several tens of times, about several thousands of times can be ensured as the durable number of times of the pogo pins 202 and the pad electrodes 6. Also, the durable number of times of the pogo pins 202 and the pad electrodes 6 is larger than the durable number of times of the gold fingers and the socket. For example, while the durable number of times of the gold fingers and the socket is about several hundreds of times, about several thousands of times can be ensured as the durable number of times of the pogo pins 202 and the pad electrodes 6. The test jig 204 including the plurality of pogo pins 202-1 to 202-11 can be said to be a highly-durable highly-stable evaluation jig.

More specifically, since the control computer 205 can simulate and efficiently reproduce the failure which has occurred in the host device of the user, easy and quick failure analysis can be carried out. Furthermore, the control computer 205 can carry out a test as to whether a future failure derived from analogy from a viewpoint of learning from failures occurs or not.

Herein, in order to simulate the failure which has occurred in the host device of the user, the internal state of the memory system 1 acquired upon occurrence of the failure on site is used.

As described above, in the present embodiment, in the memory system 1, the through-hole structures 5, which penetrate through the PCB 3 from the first surface 3a to the second surface 3b and have inner surfaces covered with the electrically-conductive film 51, are provided in the end portion 32, which is in the opposite side of the edge connector 4 of the PCB 3, and the pad electrodes 6 are provided in the vicinities of the through-hole structures 5 on the second surface 3b. By virtue of this, at a usage location (on-site) of the user, failure analysis can be carried out by using the low-price simple jig having low durability in a state in which the memory system 1 is connected to the host device, and failure analysis can be carried out by using the high-durability expensive highly-functional jig after collection (returned product). The both of on-site and after-collection failure analysis can be simplified and caused to be appropriate (for example, optimized).

Note that, in the memory system 1, as long as each of the pad electrodes 6 is electrically connected to the terminal of the controller in the cover 2 so that a test can be carried out, the pad electrode may be electrically insulated from the electrically-conductive film 51 of the corresponding through-hole structure 5. For example, each of the pad electrodes 6 may be disposed at a position close to the corresponding through-hole structure 5 and the position separated in the −X direction from the electrically-conductive film 51 of the through-hole structure 5.

Also, in a memory system 1i, as illustrated in FIG. 6, pad electrodes 6i (6i-1 to 6i-11) of the second surface 3b of the PCB 3 may be configured to have a planar dimension which is larger than the opening diameter of the through-hole structure 5. FIG. 6 is a plan view illustrating a configuration of the memory system 1i according to a first modification example of the embodiment. FIG. 6 is a plan view illustrating the memory system 1i from the second-surface-3b side of the PCB 3.

Each of the pad electrodes 6i has a Y-direction planar dimension equal to or less than the opening diameter of the through-hole structure 5, but has an X-direction planar dimension larger than the opening diameter of the through-hole structure 5. Each of the pad electrodes 6i has an approximately strip-like shape extending in the X direction in the XY planar view. Herein, in the XY planar view, the minimum planar width of the pad electrode 6i is smaller than the opening diameter of the through-hole structure 5, but the maximum planar width of the pad electrode 6i is larger than the opening diameter of the through-hole structure 5. By virtue of this, a test can be carried out even if the positioning pin and the pogo pin of the test jig are somewhat separated from each other, and the degree of freedom of disposition of the pogo pin with respect to the positioning pin can be improved. In other words, as a test jig used in the test after collection, a test jig in which the positioning pins and the pogo pins are somewhat separated from each other can be used, the degree of freedom of designing of the test jig 204 is improved, and inexpensive pogo pins such as general-purpose products can be used.

Figure 7:
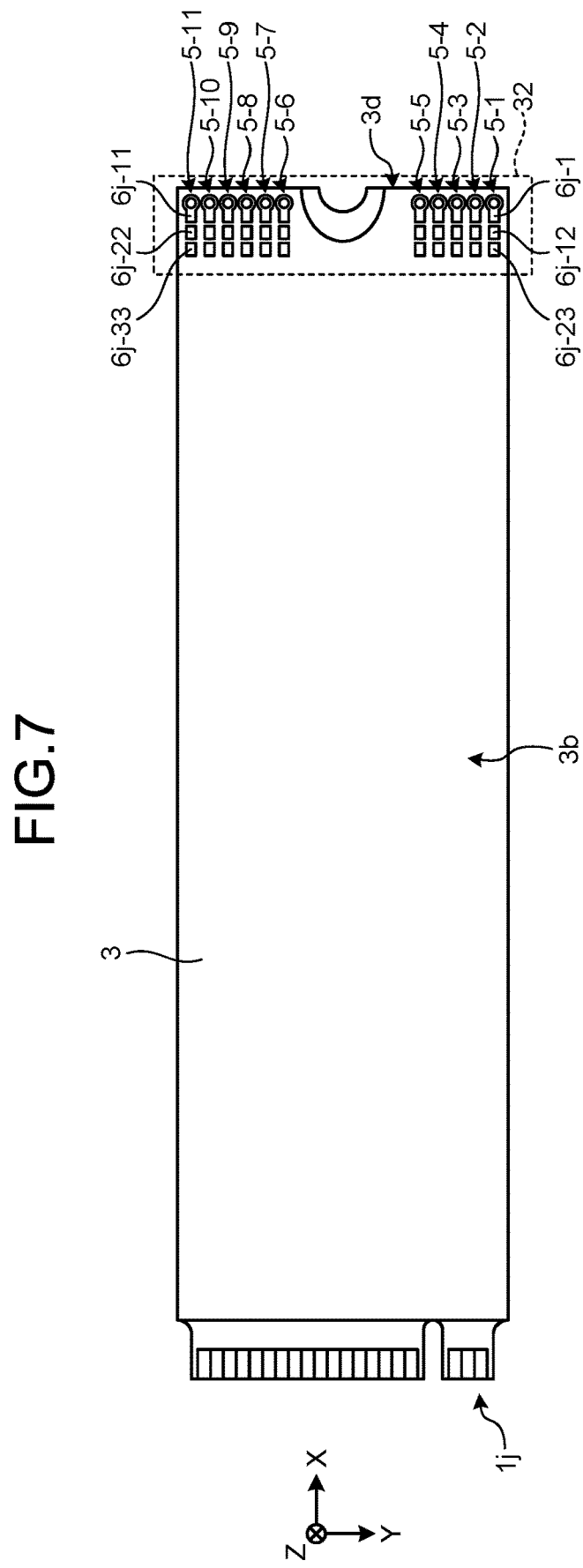
FIG. 7 is a plan view illustrating a configuration of a memory system according to a second modification example of the embodiment.

Alternatively, in a memory system 1j, as illustrated in FIG. 7, the number of the pad electrodes 6 may be larger than that of the through-hole structures 5. FIG. 7 is a plan view illustrating a configuration of the memory system 1j according to a second modification example of the embodiment. FIG. 7 illustrates an example in which the number of the through-hole structures 5 is 11, and the number of pad electrodes 6j is 33 including pad electrodes 6j-1 to 6j-33.

While the plural through-hole structures 5-1 to 5-11 are arranged in one column along the side 3d, the plural pad electrodes 6j-1 to 6j-33 are arranged in plural columns (three columns in FIG. 7) along the side 3d. The plural pad electrodes 6j-1 to 6j-33 are separated from each other in the XY directions and are electrically insulated from each other. The pad electrodes 6j-1 to 6j-11 of the first column correspond to the plural through-hole structures 5-1 to 5-11, respectively. Each of the pad electrodes 6 of the first column is electrically connected to each corresponding through-hole structure 5. The pad electrodes 6j-12 to 6j-22 of the second column correspond to the pad electrodes 6j-1 to 6j-11 of the first column and the plural through-hole structures 5-1 to 5-11, respectively. Each of the pad electrodes 6 of the second column is electrically insulated from each corresponding pad electrode 6j of the first column and is electrically insulated from each corresponding through-hole structure 5. Each of the pad electrodes 6j of the second column is disposed in the opposite side of each corresponding through-hole structure 5 with each corresponding pad electrode 6j of the first column interposed therebetween. The pad electrodes 6j-23 to 6j-33 of the third column correspond to the pad electrodes 6j-1 to 6j-11 of the first column and the pad electrodes 6j-12 to 6j-22 of the second column, respectively, and also correspond to the plural through-hole structures 5-1 to 5-11, respectively. Each of the pad electrodes 6 of the third column is electrically insulated from each corresponding pad electrode 6j of the first column, is electrically insulated from each corresponding pad electrode 6j of the second column, and is electrically insulated from each corresponding through-hole structure 5. Each of the pad electrodes 6j of the third column is disposed in the opposite side of each corresponding pad electrode 6j of the first column with each corresponding pad electrode 6j of the second column interposed therebetween.

Figure 8A:
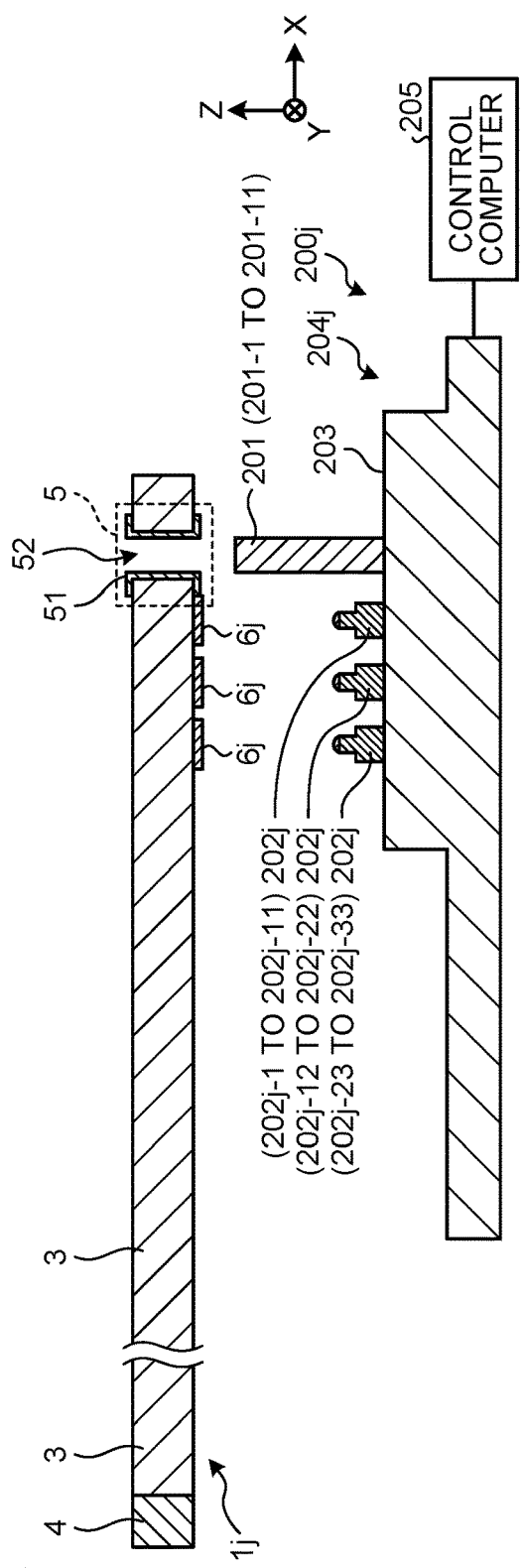
FIG. 8A and FIG. 8B are drawings illustrating contact of pogo pins with pad electrodes according to a second modification example of the embodiment.
Figure 8B:
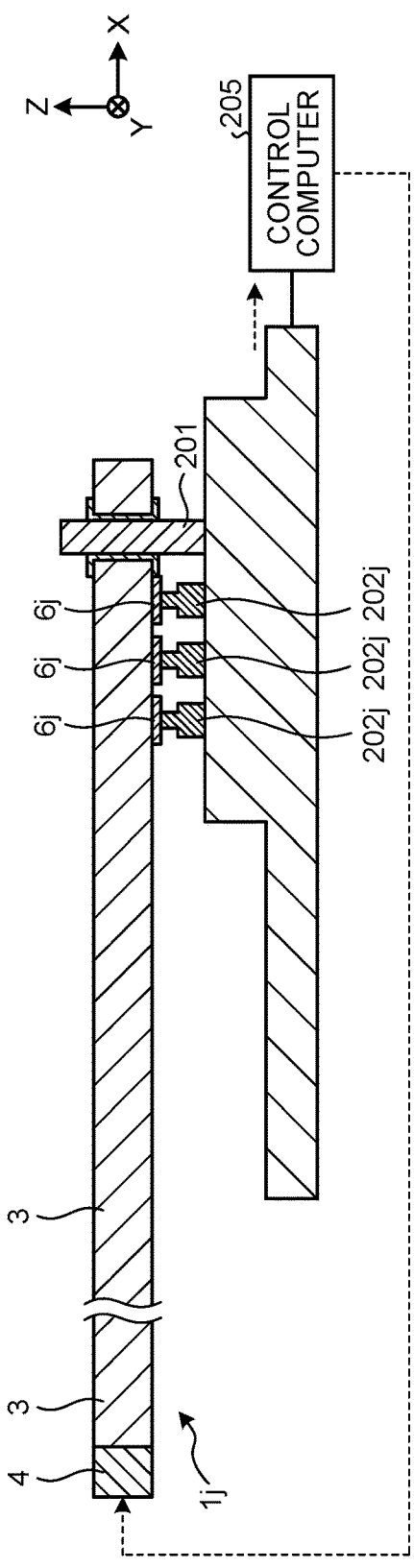

Since the number of the pad electrodes 6 is larger than that of the through-hole structures 5, the number of the signals which can be tested in an after-collection test operation can be easily increased as illustrated in FIG. 8A and FIG. 8B. FIG. 8A and FIG. 8B are drawings illustrating after-collection test operations with respect to the memory system 1 according to the second modification example of the embodiment. FIG. 8A and FIG. 8B are X-direction cross-sectional views of an approximately central portion of the through-hole structure 5 in the XY planar view.

In the after-collection test operation illustrated in FIG. 8A, a test device 200j including a test jig 204j is prepared. The test jig 204j has plural pogo pins 202j (202j-1 to 202j-33) corresponding to plural pad electrodes 6j (6j-1 to 6j-33). A point that plural pogo pins 202j-1 to 202j-33 are disposed to be close to the plural positioning pins 201-1 to 201-11 is similar to the test jig 204 illustrated in FIG. 4A. By virtue of this, when each of the positioning pins 201 is inserted to each of the through-hole structures 5, each of the pogo pins 202j can be easily aligned with the position of each of the pad electrodes 6j.

In the after-collection test operation illustrated in FIG. 8B, each of the positioning pins 201 is inserted in the through hole 52 of each of the through-hole structures 5. In this state, each of the pogo pins 202j is positioned at the position of each of the pad electrodes 6j, and the distal end portion 202a of each of the pogo pins 202j is brought into contact with each of the pad electrodes 6j (see FIG. 5B). In this state, the control computer 205 illustrated in FIG. 8B causes the memory system 1j to simulate the host device of the user on site and reproduce a failure via the edge connector 4. The control computer 205 acquires test results from the memory system 1j via the pad electrodes 6j, the pogo pins 202j, and the wires in the jig main body 203.

Herein, test result signals similar to those of the test operation of FIG. 4B can be acquired via the plural pad electrodes 6j-1 to 6j-11 and the plural pogo pins 202j-1 to 202j-11. Furthermore, signals of other test results can be additionally acquired via the plural pad electrodes 6j-12 to 6j-33 and the plural pogo pins 202j-12 to 202j-33.

For example, in addition to the signals of the test results which can be acquired by the through-hole structures 5, signals indicating the internal state of the controller (SoC), signals indicating the internal state of an interface for high-speed serial communication (for example, PCIe), signals indicating the state of a memory interface of the controller, trigger signals for measurement, etc. can be acquired as the signals of the test result.

By virtue of this, in the after-collection test, setting of a larger number of test conditions, observation/acquisition of a larger number of internal states, and cooperation with various types of measurement equipment are enabled. Therefore, more detailed and wide-range failure analysis can be quickly and easily carried out.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a printed circuit board having a first surface and a second surface, the second surface being an opposite surface of the first surface, the printed circuit board having a first end portion and a second end portion, the second end portion being a portion arranged in an opposite side of the first end portion;
a semiconductor memory and a controller both disposed on the first surface;
an edge connector connectable to a host device, the edge connector being disposed in the first end portion;
plural through-hole portions disposed in the second end portion, each penetrating from the first surface to the second surface, each having an inner surface covered with an electrically-conductive film; and
plural pad electrodes disposed on the second surface in the second end portion, wherein
at least some of the plural through-hole portions are electrically connected to the controller, and
at least some of the plural pad electrodes are electrically connected to the controller.

2. The memory system according to claim 1, wherein the plural pad electrodes are arranged at positions close to the plural through-hole portions.

3. The memory system according to claim 2, wherein at least one of the pad electrodes is electrically connected to an electrically-conductive film of a corresponding one among the plural through-hole portions.

4. The memory system according to claim 2, wherein at least one of the pad electrodes is electrically insulated from the electrically-conductive films of the plural through-hole portions.

5. The memory system according to claim 1, wherein at least one of the plural through-hole portions has a circular part on the first surface or the second surface, and at least one of the plural pad electrodes has a strip shaped part on the second surface.

6. The memory system according to claim 1, wherein a minimum planar width of the at least one of the plural pad electrodes is smaller than an opening diameter of a corresponding one among the through-hole portions.

7. The memory system according to claim 1, wherein a maximum planar width of at least one of the plural pad electrodes is larger than an opening diameter of a corresponding one among the through-hole portions.

8. The memory system according to claim 1, wherein the number of the plural pad electrodes is larger than the number of the plural through-hole portions.

9. The memory system according to claim 1, wherein the plural pad electrodes include first pad electrodes electrically connected to the electrically-conductive films of the through-hole portions and second pad electrodes electrically insulated from the electrically-conductive films of the through-hole portions.

10. The memory system according to claim 9, wherein at least one of the second pad electrodes is disposed in an opposite side of a corresponding one among the through-hole portions with a corresponding one among the first pad electrodes interposed between the at least one of the second pad electrodes and the corresponding one among the through-hole portions.

11. The memory system according to claim 9, wherein the plural pad electrodes further include third pad electrodes electrically insulated from the electrically-conductive films of the through-hole portions,
at least one of the second pad electrodes is disposed in an opposite side of a corresponding one among the through-hole portions with a corresponding one among the first pad electrodes interposed between the at least one of the second pad electrodes and the corresponding one among the through-hole portions, and
at least one of the third pad electrodes is disposed in an opposite side of the corresponding one among the first pad electrodes with the at least one of the second pad electrodes interposed between the at least one of the third pad electrodes and the corresponding one among the first pad electrodes.

12. The memory system according to claim 1, wherein the printed circuit board has a first corner portion and a second corner portion at both ends of the second end portion, and
the plural through-hole portions include first through-hole portions disposed to be close to the first corner portions and second through-hole portions disposed to be close to the second corner portions.

13. The memory system according to claim 1, wherein
the printed circuit board has a first corner portion and a second corner portion at both ends of the second end portion and has a cutout portion between the first corner portion and the second corner portion, and
the plural through-hole portions include first through-hole portions disposed between the first corner portion and the cutout portion and a second through-hole portions disposed between the cutout portion and the second corner portions.

14. The memory system according to claim 1, wherein
the printed circuit board has a first corner portion and a second corner portion at both ends of the second end portion and has a cutout portion between the first corner portion and the second corner portion, and
the number of first through-hole portions disposed between the first corner portion and the cutout portion and the number of second through-hole portions disposed between the cutout portion and the second corner portion are different from each other.

15. The memory system according to claim 1, wherein
at least one of the electrically-conductive films has a first part having a cylindrical shape.

16. The memory system according to claim 15, wherein
the at least one of the electrically-conductive films further has a hollowed-disk-shaped second part connected to a first edge portion of the first part in a side of the first surface and provided on the first surface, and has a hollowed-disk-shaped third part connected to a second edge portion of the first part in a side of the second surface and provided on the second surface.

17. The memory system according to claim 1, wherein
at least one of the plural pad electrodes extends in a direction from the second end portion toward the first end portion.

18. The memory system according to claim 1, wherein
an opening diameter of each of the plural through-hole portions corresponds to a maximum planar width of each of spring-type first pins contactable to a corresponding one among the through-hole portions, and
a planar dimension of each of the plural pad electrodes corresponds to a planar width of a distal end portion of each of second pins contactable to a corresponding one among the pad electrodes.

19. The memory system according to claim 18, wherein
an opening diameter of at least one of the through-hole portions is smaller than a maximum planar width of a corresponding one among the first pins, and a planar dimension of at least one among the pad electrodes is larger than a planar width of a distal end portion of a corresponding one among the second pins.

20. The memory system according to claim 18, wherein
the opening diameter of each of the plural through-hole portions corresponds to a diameter of each of a third pins capable of positioning a corresponding one among the second pins at a corresponding one among the pad electrodes.

* * * * *